(12) United States Patent
Sreenivasan et al.

(10) Patent No.: US 7,491,637 B2
(45) Date of Patent: Feb. 17, 2009

(54) FORMATION OF CONDUCTIVE TEMPLATES EMPLOYING INDIUM TIN OXIDE

(75) Inventors: Sidlgata V. Sreenivasan, Austin, TX (US); Ian M. McMackin, Austin, TX (US); Byung-Jin Choi, Austin, TX (US); Ronald D. Voisin, Fremont, CA (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 11/470,829

(22) Filed: Sep. 7, 2006

(65) Prior Publication Data

US 2007/0026542 A1  Feb. 1, 2007

Related U.S. Application Data

(62) Division of application No. 10/706,537, filed on Nov. 12, 2003.

(51) Int. Cl.
*H01L 21/4763* (2006.01)
(52) U.S. Cl. .................................................. 438/622
(58) Field of Classification Search ............. 438/11–18, 438/100, 105–107, 597, 612–613, 660–667; 257/48, 737, 315–317
See application file for complete search history.

(56) References Cited

U.S. PATENT DOCUMENTS 6,309,957 B1 * 10/2001 Tu et al. ...................... 438/622
6,878,985 B2 *  4/2005 Arai et al. .................... 257/315

* cited by examiner

*Primary Examiner*—Michael S. Lebentritt
*Assistant Examiner*—Andre' Stevenson
(74) *Attorney, Agent, or Firm*—Kelly K. Kordzik; Fish & Richardson P.C.

(57) ABSTRACT

The present invention is directed to a method forming conductive templates that includes providing a substrate; forming a mesa on the substrate; and forming a plurality of recessions and projections on the mesa with a nadir of the recessions comprising electrically conductive material and the projections comprising electrically insulative material. It is desired that the mesa be substantially transparent to a predetermined wavelength of radiation, for example ultraviolet radiation. As a result, it is desired to form the electrically conductive material from a material that allows ultraviolet radiation to propagate therethrough. In the present invention indium tin oxide is a suitable material from which to form the electrical conductive material.

17 Claims, 11 Drawing Sheets

FORMATION OF CONDUCTIVE TEMPLATES EMPLOYING INDIUM TIN OXIDE

CROSS-REFERENCE TO RELATED PATENT APPLICATIONS

The present application is a divisional patent application of U.S. patent application Ser. No. 10/706,537, filed Nov. 12, 2003 and entitled "Formation of Conductive Templates Employing Indium Tin Oxide," and listing Sidlgata V. Sreenivasan, Ian M. McMackin, Byung-Jin Choi, and Ronald D. Voisin as inventors; the entirety of which is incorporated by reference herein.

BACKGROUND OF THE INVENTION

The field of invention relates generally to imprint lithography. More particularly, the present invention is directed to reducing the time required to fill the features of a template with imprinting material during imprint lithography processes.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and to polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required and the minimum feature dimension provided by this technique are dependent upon, inter alia, the composition of the polymerizable material.

It is desired, therefore, to provide a technique that decreases the time required to fill a feature of an imprint lithography template.

SUMMARY OF THE INVENTION

The present invention is directed to a conductive template and of a method forming conductive templates that includes providing a substrate; forming a mesa on the substrate; and forming a plurality of recessions and projections on the mesa with a nadir of the recessions comprising electrically conductive material and the projections comprising electrically insulative material. It is desired that the mesa be substantially transparent to a predetermined wavelength of radiation, for example ultraviolet radiation. As a result, it is desired to form the electrically conductive material from a material that allows ultraviolet radiation to propagate therethrough. In the present invention indium tin oxide is a suitable material from which to form the electrical conductive material. However, indium tin oxide is difficult to pattern due to its resistance to etch. Nonetheless, the present method provides a manner in which to form a conductive template with indium oxide suitable for use in imprint lithography. These other embodiments are discussed more fully below.

DETAILED DESCRIPTION OF THE INVENTION

Figure 1:
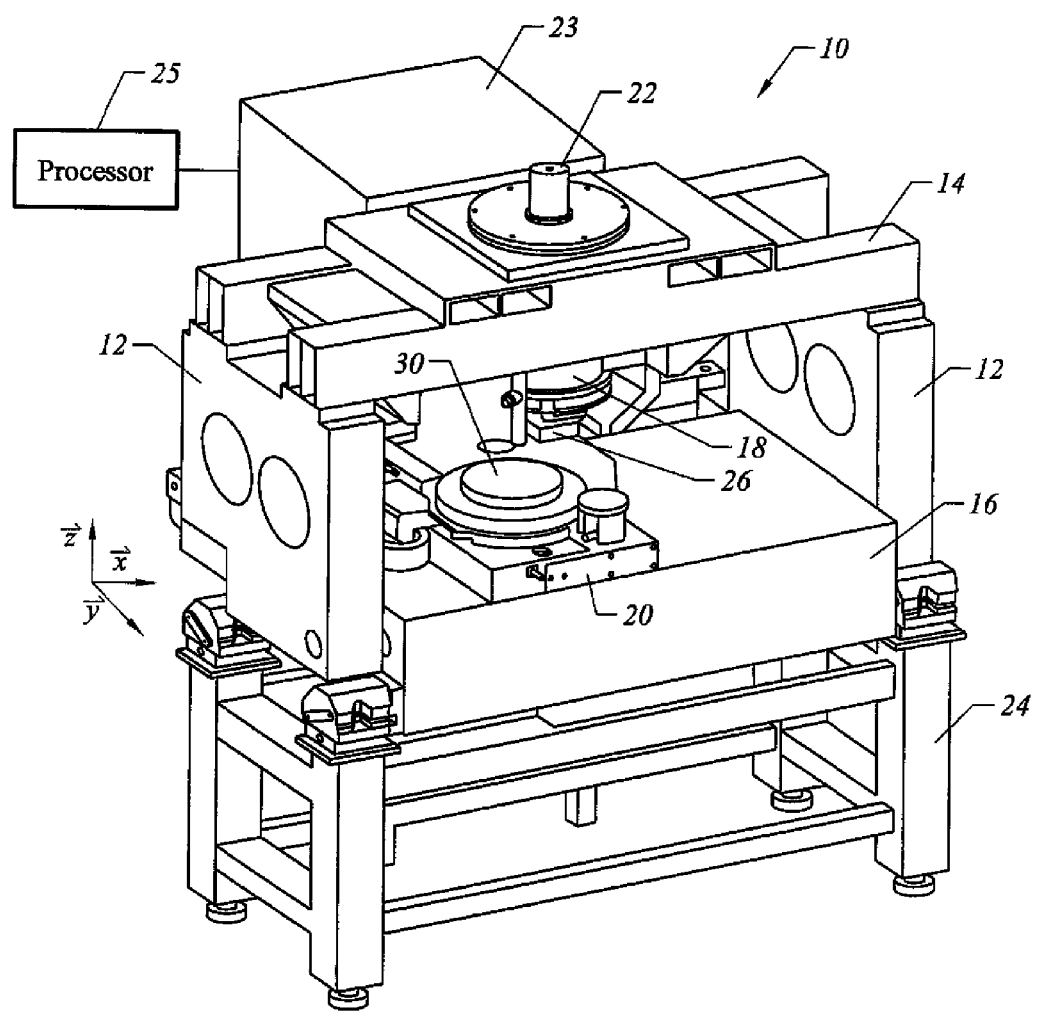
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16 and provides movement along the Z-axis. Disposed upon stage support 16 to face imprint head 18 is a motion stage 20. Motion stage 20 is configured to move with respect to stage support 16 along X- and Y-axes. It should be understood that imprint head 18 may provide movement along the X- and Y-axes, as well as the Z-axis, and motion stage 20 may provide movement in the Z-axis, as well as the X- and Y-axes. An exemplary motion stage device is disclosed in U.S. patent application Ser. No. 10/194,414, filed Jul. 11, 2002, entitled "Step and Repeat Imprint Lithography Systems," assigned to the assignee of the present invention, and which is incorporated by reference herein in its entirety. A radiation source 22 is coupled to system 10 to impinge actinic radiation upon motion stage 20. As shown, radiation source 22 is coupled to bridge 14 and includes a power generator 23 connected to radiation source 22. Operation of system is typically controlled by a processor 25 that is in data communication therewith.

Figure 2:
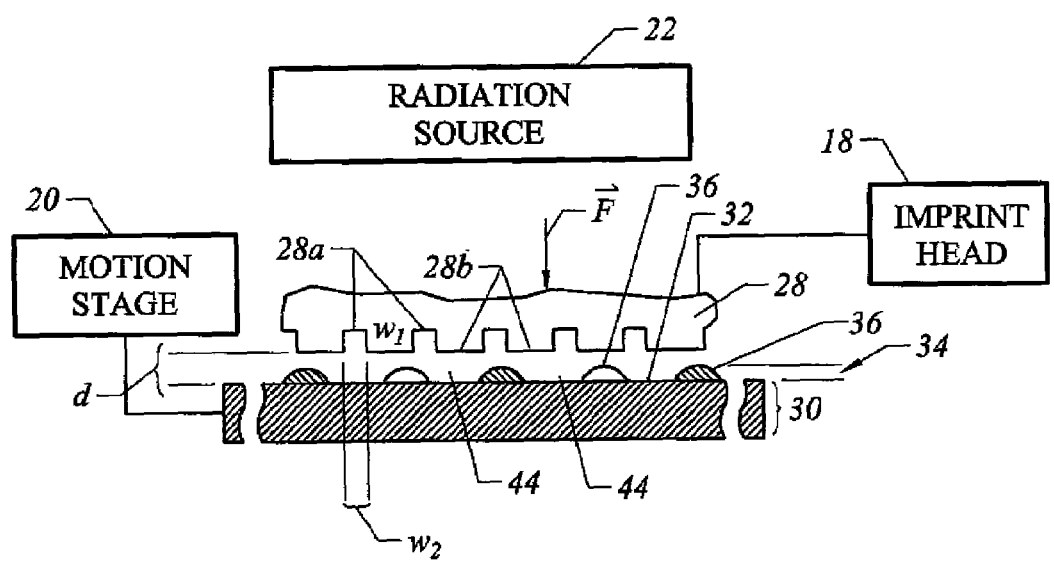
FIG. 2 is a simplified elevation view of a lithographic system shown in FIG. 1.

Referring to both FIGS. 1 and 2, connected to imprint head 18 is a template 26 having a mold 28 thereon. Mold 28 includes a plurality of features defined by a plurality of spaced-apart recessions 28a and protrusions 28b. The plurality of features defines an original pattern that is to be transferred into a substrate 30 positioned on motion stage 20. To that end, imprint head 18 and/or motion stage 20 may vary a distance "d" between mold 28 and substrate 30. In this manner, the features on mold 28 may be imprinted into a flowable region of substrate 30, discussed more fully below. Radiation source 22 is located so that mold 28 is positioned between radiation source 22 and substrate 30. As a result, mold 28 is fabricated from material that allows it to be substantially transparent to the radiation produced by radiation source 22. To that end, mold 28 may be formed from materials that includes quartz, fused-silica, silicon, sapphire, organic polymers, siloxane polymers, borosilicate glass, fluorocarbon polymers or a combination thereof. Further template 26 may be formed from the aforementioned materials, as well as metal.

Figure 3:
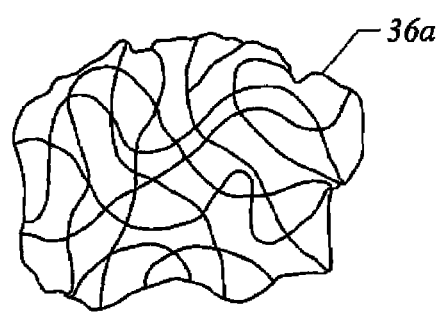
FIG. 3 is a simplified representation of material from which an imprinting layer, shown in FIG. 2, is comprised before being polymerized and cross-linked.

Referring to both FIGS. 2 and 3, a flowable region, such as an imprinting layer 34, is disposed on a portion of surface 32 that presents a substantially planar profile. An exemplary flowable region consists of imprinting layer 34 being deposited as a plurality of spaced-apart discrete droplets 36 of material 36a on substrate 30, discussed more fully below. An exemplary system for depositing droplets 36 is disclosed in U.S. Pat. No. 6,926,929, filed Jul. 9, 2002, entitled "System and Method for Dispensing Liquids," and which is assigned to the assignee of the present invention, and which is incorporated by reference herein in its entirety. Imprinting layer 34 is formed from a material 36a that may be selectively polymerized and cross-linked to record the original pattern therein, defining a recorded pattern. An exemplary composition for material 36a is disclosed in U.S. patent application Ser. No. 10/463,396, filed Jun. 16, 2003 and entitled "Method to Reduce Adhesion Between a Conformable Region and a Pattern of a Mold," which is incorporated by reference in its entirety herein. Material 36a is shown in FIG. 4 as being cross-linked at points 36b, forming cross-linked polymer material 36c.

Figure 5:
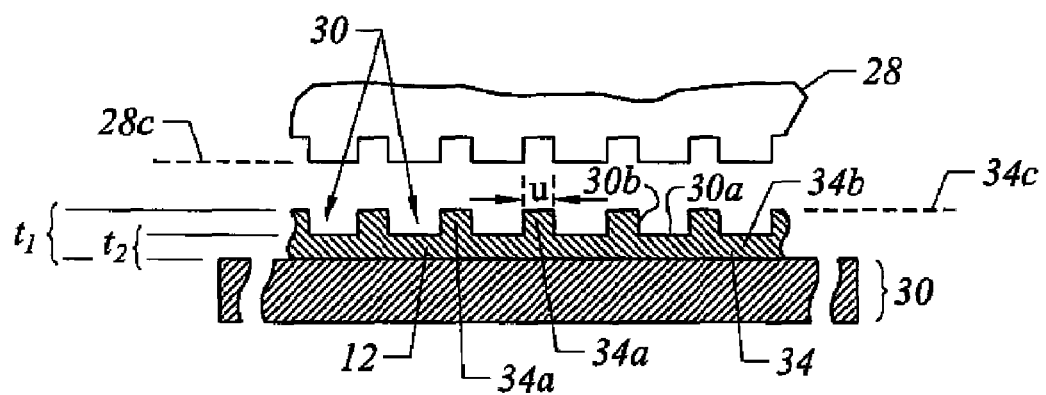
FIG. 5 is a simplified elevation view of a mold spaced-apart from the imprinting layer, shown in FIG. 1, after patterning of the imprinting layer.

Referring to FIGS. 2, 3 and 5, the pattern recorded in imprinting layer 34 is produced, in part, by mechanical contact with mold 28. To that end, distance "d" is reduced to allow imprinting droplets 36 to come into mechanical contact with mold 28, spreading droplets 36 so as to form imprinting layer 34 with a contiguous formation of material 36a over surface 32. In one embodiment, distance "d" is reduced to allow sub-portions 324a of imprinting layer 34 to ingress into and to fill recessions 28a.

To facilitate filling of recessions 28a, material 36a is provided with the requisite properties to completely fill recessions 28a while covering surface 32 with a contiguous formation of material 36a. In the present embodiment, sub-portions 34b of imprinting layer 34 in superimposition with protrusions 28b remain after the desired, usually minimum, distance "d", has been reached, leaving sub-portions 324a with a thickness $t_1$ and sub-portions 34b with a thickness $t_2$. Thicknesses "$t_1$" and "$t_2$" may be any thickness desired, dependent upon the application. Typically, $t_1$ is selected so as to be no greater than twice the width u of sub-portions 324a, i.e., $t_1 \leq 2u$, shown more clearly in FIG. 5.

Figure 4:
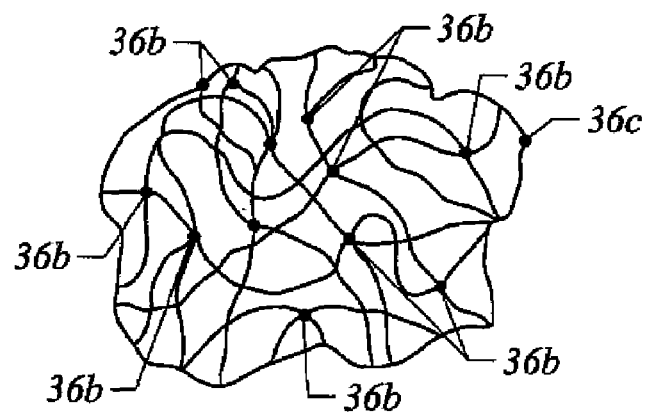
FIG. 4 is a simplified representation of cross-linked polymer material into which the material shown in FIG. 3 is transformed after being subjected to radiation.

Referring to FIGS. 2, 3 and 4, after a desired distance "d" has been reached, radiation source 22 produces actinic radiation that polymerizes and cross-links material 36a, forming cross-linked polymer material 36c. As a result, the composition of imprinting layer 34 transforms from material 36a to cross-linked polymer material 36c, which is a solid. Specifically, cross-linked polymer material 36c is solidified to provide side 34c of imprinting layer 34 with a shape conforming to a shape of a surface 28c of mold 28, shown more clearly in FIG. 5. After imprinting layer 34 is transformed to consist of cross-linked polymer material 36c, shown in FIG. 4, imprint head 18, shown in FIG. 2, is moved to increase distance "d" so that mold 28 and imprinting layer 34 are spaced-apart.

Referring to FIG. 5, additional processing may be employed to complete the patterning of substrate 30. For example, substrate 30 and imprinting layer 34 may be etched to transfer the pattern of imprinting layer 34 into substrate 30, providing a patterned surface 34c. To facilitate etching, the material from which imprinting layer 34 is formed may be varied to define a relative etch rate with respect to substrate 30, as desired.

Figure 6:
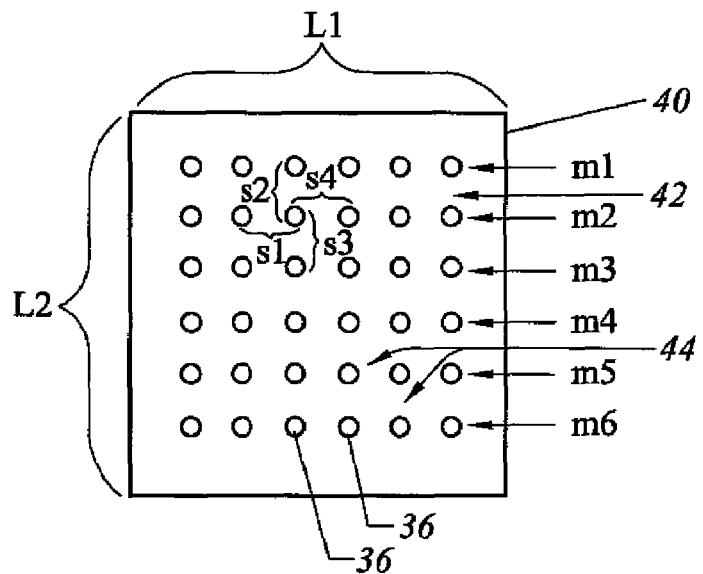
FIG. 6 is a top down view showing an array of droplets of imprinting material deposited upon a region of the substrate shown above in FIG. 2 in accordance with a first embodiment of the present invention.

Referring to FIGS. 2, 3 and 6, for molds having very dense features, e.g., recessions 28a on the order of nanometers, spreading droplets 36 over a region 40 of substrate 30 in superimposition with mold 28 to fill the recessions 28a can require long periods of time, thereby slowing throughput of the imprinting process. To facilitate an increase in the throughput of the imprinting process droplets 36 are dispensed to minimize the time required to spread over substrate 30 and to fill recessions 28a. This is achieved by dispensing droplets 36 as a two-dimensional matrix array 42 so that a spacing, shown as $S_1$ and $S_2$, between adjacent droplets 36 is minimized. As shown, droplets 36 of matrix array 42 area arranged in six columns $n_1$-$n_6$ and six rows $m_1$-$m_6$. However, droplets 36 may be arranged in virtually any two-dimensional arrangement on substrate 30. What is desired is maximizing the number of droplets 36 in matrix array 42, for a given total volume, $V_t$, of imprinting material 36 necessary to form a desired patterned layer. This minimizes the spacing $S_1$ and $S_2$ between adjacent droplets. Further, it is desired that each of droplets 36 in the subset have substantially identical quantities of imprinting material 36a associated therewith, defined as a unit volume, $V_u$. Based upon these criteria, it can be determined that the total number, n, of droplets 36 in matrix array 42 may be determined as follows:

$$n = V_t/N_u \qquad (1)$$

where $V_t$ and $V_u$ are defined above. Assume a square array of droplets 36 where the total number, n, of droplets 36 is defined as follows:

$$n = n_1 \times n_2 \qquad (2)$$

where $n_1$ is that number of droplets along a first direction and $n_2$ is the number of droplets along a second direction A spacing $S_1$ between adjacent droplets 36 along a first direction, i.e., in one dimension, may be determined as follows:

$$S_1 = L_1/n_1 \qquad (3)$$

where $L_1$ is the length of region 40 along the first direction. In a similar fashion, a spacing $S_2$ between adjacent droplets 36 along a second direction extending transversely to the first direction may be determined as follows:

$$S_2 = L_2/n_2 \qquad (4)$$

where $L_2$ is the length of region 40 along the second direction.

Considering that the unit volume of imprinting material 36a associated with each of droplets 36 is dependent upon the dispensing apparatus, it becomes clear that spacings $S_1$ and $S_2$ are dependent upon the resolution, i.e., operational control of the droplet dispensing apparatus (not shown) employed to form droplets 36. Specifically, it is desired that the dispensing apparatus (not shown) be provided with a minimum quantity of imprinting material 36a in each of droplets 36 so that the same may be precisely controlled. In this fashion, the area of region 40 over which imprinting material 36a in each droplet 36 must travel is minimized. This reduces the time required to fill recessions 28 and cover substrate with a contiguous layer of imprinting material 36a.

Another problem that the present invention seeks to avoid is the trapping of gases in imprinting layer 34 once patterned surface 34c is formed. Specifically, in the volume 44 between spaced-apart droplets 36 of matrix array 42, there are gases present, and droplets 36 in matrix array 42 are spread over region 40 so as to avoid, if not prevent, trapping of gases therein. To that end, in accordance with one embodiment of the present invention, a subset of droplets 36 in matrix array 42 that are compressed along a first direction by mold 28 along a first direction and subsequently compressing the remaining droplets 36 of matrix array 42 along a second direction, extending transversely to the first direction. This is achieved by cantilevering impingement of mold 28 onto droplets 36, shown in FIG. 8.

Figure 7:
FIG. 7 is a simplified schematic view of cantilevering impingement of a mold, shown in FIG. 2, impinging upon the array of droplets, shown in FIG. 6, in accordance with one embodiment of the present invention.
Figure 8:
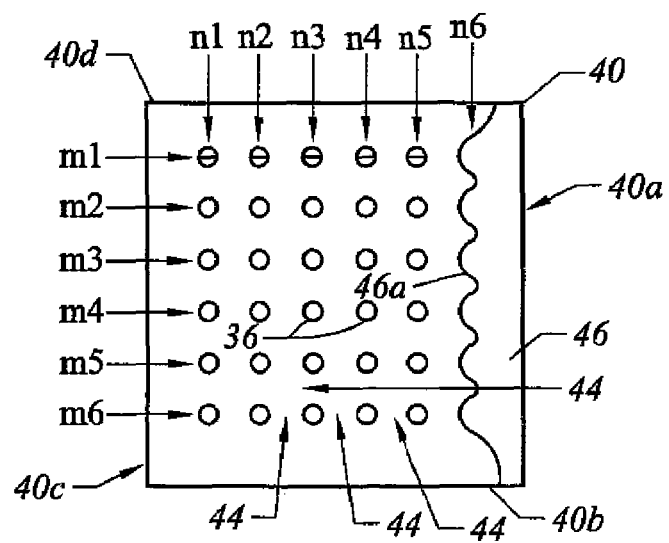
FIGS. 8-11 are top down views showing the compression of droplets, shown above in FIG. 6, employing cantilevering impingement of mold, shown in FIG. 7.

Referring to FIGS. 6, 7 and 8, template 26 is positioned so that surface 28c of mold 28 forms an oblique angle θ with respect to substrate surface 30a of substrate 30, referred to as cantilevering impingement. An exemplary apparatus that facilitates formation of angle θ is disclosed in U.S. Pat. No. 6,873,087, filed Oct. 27, 2000 and entitled "High-Precision Orientation Alignment and Gap Control Stages for Imprint Lithography Processes," which is incorporated by reference in its entirety herein. As a result of the cantilevering impingement of mold 28, as a distance between mold 28 and substrate 30 decreases, a sub-portion of mold 28 will come into contact with a sub-set of droplets 36 in matrix array 42 before the remaining portions of mold 28 contact the one edge of mold 28 contact the remaining droplets 36 of matrix array 42. As shown, mold 28 contacts all of droplets 36 associated with column $n_6$, substantially concurrently. This causes droplets 36 to spread and to produce a contiguous liquid sheet 46 of imprinting material 36a extending from edge 40a of region 40 toward droplets in columns $n_1$-$n_5$. One edge of liquid sheet 46 defines a liquid-gas interface 46a that functions to push gases in volumes 44 away from edge 40a and toward edges 40b, 40c and 40d. Volumes 44 between droplets 36 in columns $n_1$-$n_5$ define gas passages through which gas may be pushed to the portion of perimeter of region 40. In this manner, interface 46a in conjunction with the gas passages reduces, if not prevents, trapping of gases in liquid sheet 46.

Figure 9:
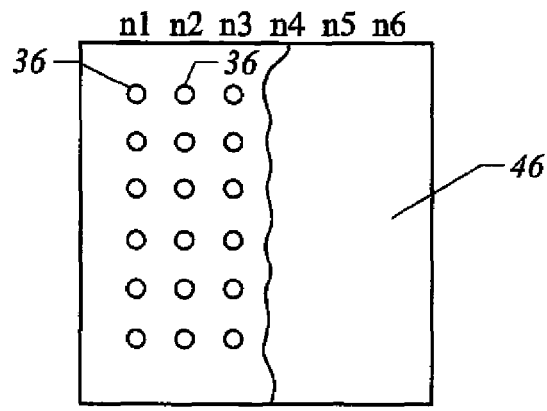
Figure 10:
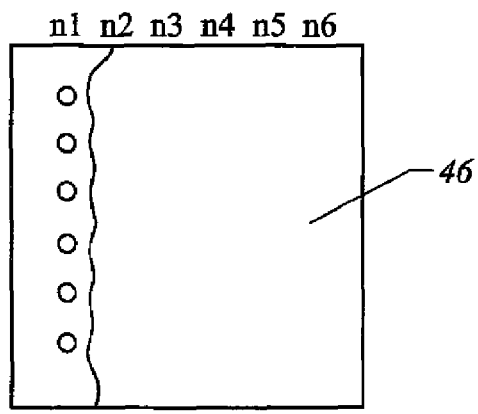
Figure 11:
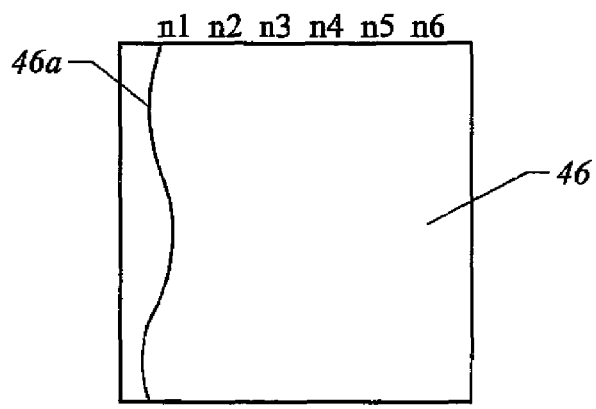

Referring to FIGS. 7 and 9, as template 26 is moved toward substrate 30, rotation of mold 28 occurs to allow imprinting material 36a associated with subsequent subsets of droplets 36 in columns $n_4$ and $n_5$ to spread and to become included in contiguous fluid sheet 46. Template 26 continues to rotate so that mold 28 subsequently comes into contact with droplets 36 associated with columns $n_2$ and $n_3$ so that the imprinting material 36a associated therewith spreads to become included in contiguous sheet 46, shown in FIG. 10. The process continues until all droplets 36 are included in contiguous sheet 46, shown in FIG. 11. As can be seen, interface 46a has moved toward edge 40c so that there is an unimpeded path for the gases (not shown) in the remaining volume 44a of region 40 to travel thereto. This allows gases in volume 44a to egress from region 40 vis-à-vis edge 40c. In this manner, the trapping of gases in imprinting layer 34, shown in FIG. 5, having surface 34c is reduced, if not avoided.

Figure 12:
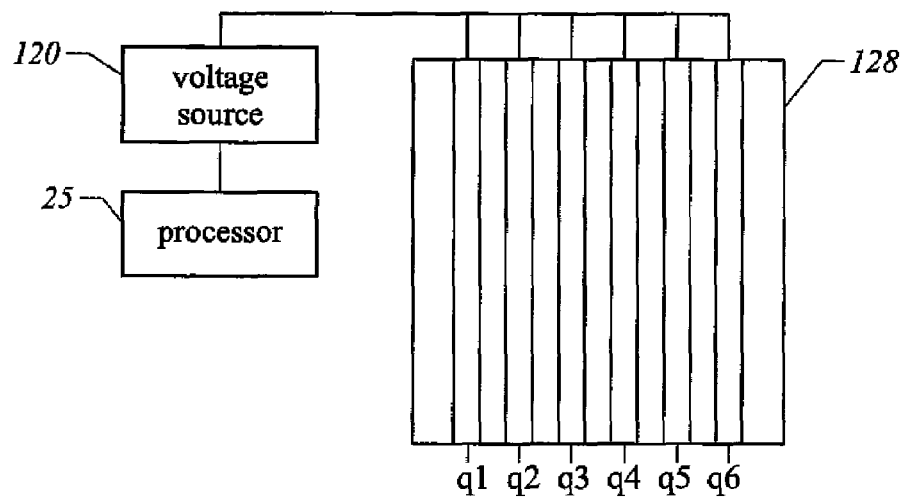
FIG. 12 is a bottom up view of a mold having individually addressable electrical conductors in accordance with an alternate embodiment of the present invention.
Figure 13:
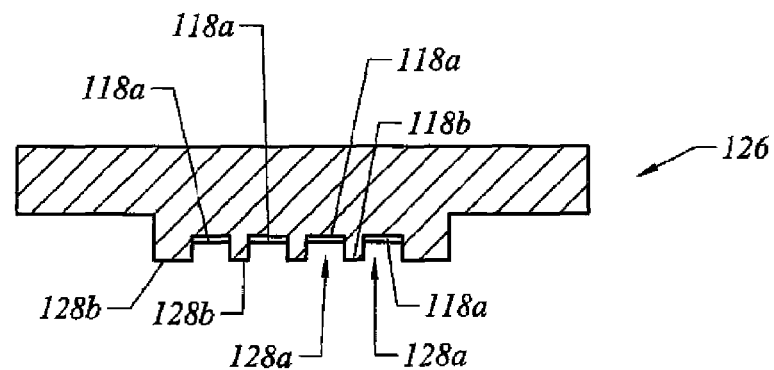
FIG. 13 is a side cross-sectional view of the template shown in FIG. 12.

Referring to FIGS. 3, 12 and 13, in another embodiment of the present invention, sequential spreading of droplets 36 in matrix array 42 column-by-column, as described with respect to FIGS. 7-11 may be achieved without requiring cantilevering impingement of mold 28. This may be achieved by employing electromagnetic forces to move imprinting material 36a across region 40 and/or toward mold 128. To that end, mold 128 includes a plurality of individually addressable conductive elements, shown as $q_1$-$q_6$ forming nadirs 118a of recessions 128a of mold 128. Sub-portions 118b of body 150 flanking sub-portions 118b are in superimposition with protrusions 128b and do not include any conductive material there. Formation of mold 128 is discussed more fully below.

Figure 14:
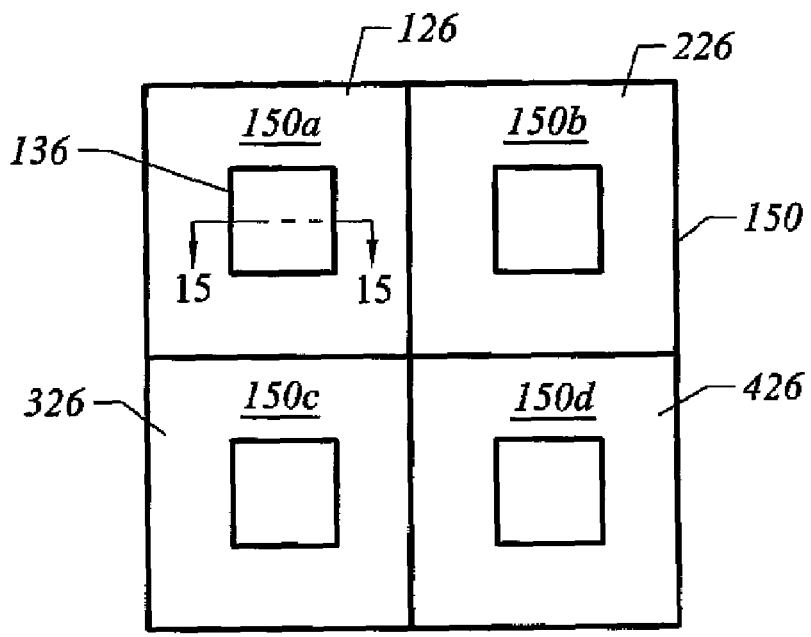
FIG. 14 is a top down view of a substrate employed to fabricate the template shown in accordance with yet another embodiment of the present invention.

Referring to FIG. 14, one manner in which to form a template includes obtaining a body 150 and identifying four regions 150a, 150b, 150c and 150d on which to form a template. Specifically, body 150 consists of a standard 6025 fused silica. Four templates, shown as templates 126, 226, 326 and 426, are formed, concurrently, in four separate areas of body 150. For simplicity of the present disclosure, fabrication of template 126 is discussed with the understanding that the discussion with respect to template 126 applies with equal weight to templates 226, 326 and 426.

Figure 15:
FIG. 15 is a side cross-sectional view of a region of the substrate, shown in FIG. 14, taken across lines 15-15.
Figure 16:
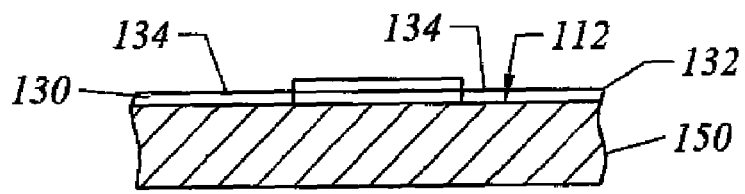
FIGS. 16-23 are side cross-sectional views of the region shown in FIG. 15 demonstrating the various processes employed to fabricate the template shown in FIG. 13.

Referring to FIGS. 15 and 16, body 150, typically measures 152.4 mm on a side. Body 150 has a chrome layer 130 present on an entire side 112 thereof. A photoresist 132 layer covers chrome layer 130. Photoresist layer 132 is patterned and developed away to expose a region 134 surrounding a central portion 136 of side 112. Central portion 136 typically has dimensions measuring 25 mm on a side. Typically, photoresist layer 132 is patterned employing a laser writer. After photoresist layer 132 has been developed away, chrome layer 130 in superimposition with region 134 is etched away using any suitable etching techniques, e.g., ammonium nitrate or plasma etch. In this manner, a portion of body 150 in superimposition with region 134 is exposed. Thereafter, suitable post etching processes may occur, e.g., an oven bake or other cleaning processes.

Figure 18:
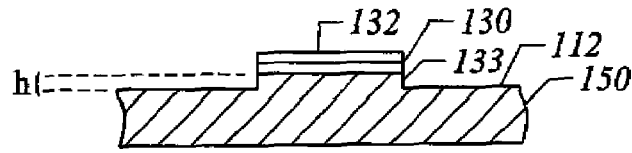
Figure 19:
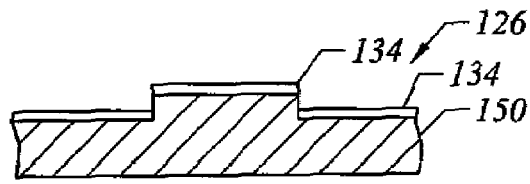
Figure 20:
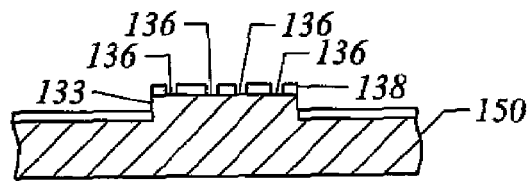
Figure 21:
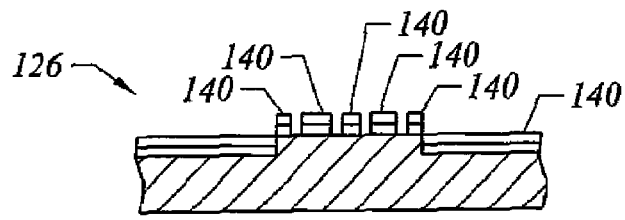
Figure 22:
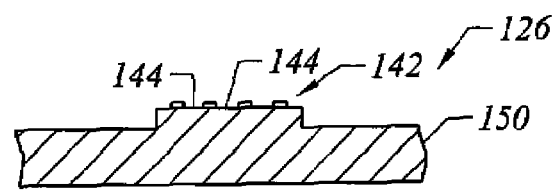
Figure 23:
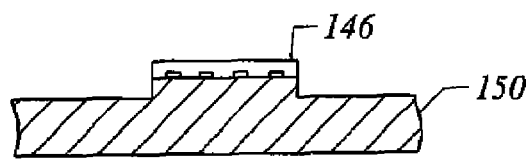

Assuming body 150 is formed from fused-silica, a suitable etching technique would involve a buffered oxide etch (BOE). This occurs for a sufficient amount of time to provide a desired height, h, for mesa 133, as measured from surface 112 of body 150, shown in FIG. 18. An exemplary height is 15 microns. Thereafter, the remaining portion of photoresist layer 132 is removed and any remaining portions of chrome layer 130 on central portion 136 are removed. A layer of photoresist material 134 is deposited over template 126, shown in FIG. 19. Regions of photoresist material 134 in superimposition with mesa 133 are patterned and developed away to expose regions 136 of body 150, using standard techniques, leaving patterned photoresist layer 138, shown in FIG. 20. Thereafter, a layer of indium tin oxide (ITO) 140 is deposited on template 126 to cover patterned photoresist layer 138, shown in FIG. 21. ITO is a suitable material for use with mold 128, because it is electrically conductive and substantially transparent to the wavelength of radiation produced by radiation source 22, shown in FIG. 2. A lift-off process is employed to remove patterned photoresist layer 138, shown in FIG. 20, with all of the portions of ITO layer not in superimposition with regions 136 being removed during the lift-off process. In this fashion, a patterned ITO layer 142, with regions 144 of body 150 being exposed, is formed, shown in FIG. 22. Following formation of patterned ITO layer 142, a layer 146 of silicon oxide $SiO_2$ 146 is deposited, shown in FIG. 23. This forms mold 128, with silicon oxide layer 146 being patterned so that silicon oxide is not in superimposition with ITO material in ITO layer 142 that is in superimposition with regions 144, shown in FIG. 13. In this manner, the nadir of recessions 128a are formed from ITO, and protrusions 128b are formed from $SiO_2$.

Referring to FIGS. 3, 12 and 13, understanding that protrusions 128a are formed from an electrically insulative material, it is realized that the electromagnetic field, $EM_1$, proximate to recess 128a is greater than the electromagnetic field, $EM_2$, that is proximate to protrusions 128b. To this end, voltage source 120 is in electrical communication with conductive elements $q_1$-$q_2$ using any suitable coupling technique known, shown in FIG. 12. In the present example, conductive elements $q_1$-$q_6$ are formed to extend beyond mold 128 and voltage source 120 is connected thereto. Furthermore, by selectively addressing the conducting elements $q_1$-$q_6$, selected droplets 36 may be selectively spread in virtually any manner desired, including the spread pattern discussed above with respect to FIGS. 7-11.

Figure 24:
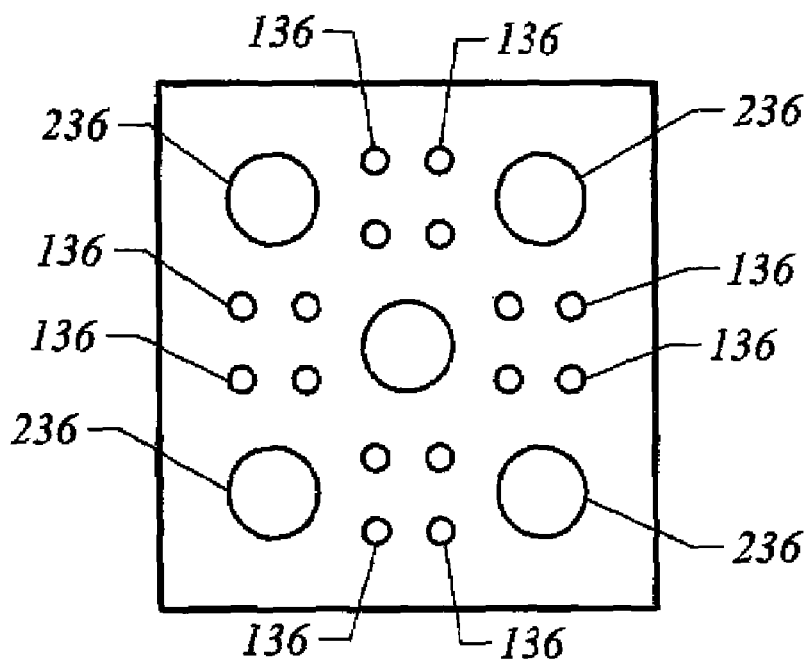
FIG. 24 is a top down view of the region shown in FIG. 6, with the droplets of imprinting material disposed in an array according to yet a fourth embodiment of the present invention.
Figure 25:
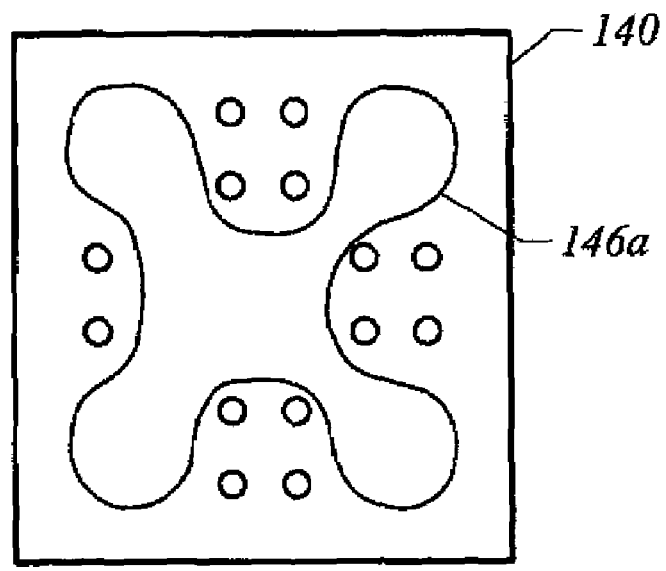
FIG. 25 is a top down view showing the compression of droplets, shown above in FIG. 24, employing mold, shown in FIG. 2, in accordance with a fifth embodiment of the present invention.

Referring to FIGS. 3, 24 and 25, as discussed above, droplets 136 and 236 may be arranged in virtually any matrix array. As shown, droplets 136 and 236 are arranged in two sets. The quantity of imprinting material 36a in each of droplets 136 is substantially identical, and the quantity of imprinting material 36a in each of droplets 236 is substantially identical. The quantity of imprinting material in each of droplets 236 is substantially greater than the quantity of imprinting material 36a in each of droplets 136. By arranging droplets 136 and 236 with differing quantities of imprinting material 36a in this fashion, it is believed that the time required to fill recessions 128a of mold 28 may be minimized while avoiding trapping of gases in imprinting layer 36a, without employing cantilevering impingement of mold 128 onto substrate 30. Specifically, by providing droplets 136 with a minimum volume, the advantages discussed above with respect to reduced filling time of recessions 128a is achieved. The relatively large quantity of imprinting material 36a, shown in FIG. 3, in droplets 236, shown in FIG. 24, and the location of the same increases the probability that the flow of imprinting material-gas interface 146a created by droplets 236 will be sufficiently forceful to drive gas toward perimeter of region 140 without trapping gas in imprinting material 36a.

Referring to FIGS. 3,12 and 24, to further decrease the time required to spread and to pattern imprinting material 36a in droplets 136 and 236, template 128 may be employed and conductive elements $q_1$-$q_6$ may be activated sequentially, as discussed above, or concurrently.

Figure 26:
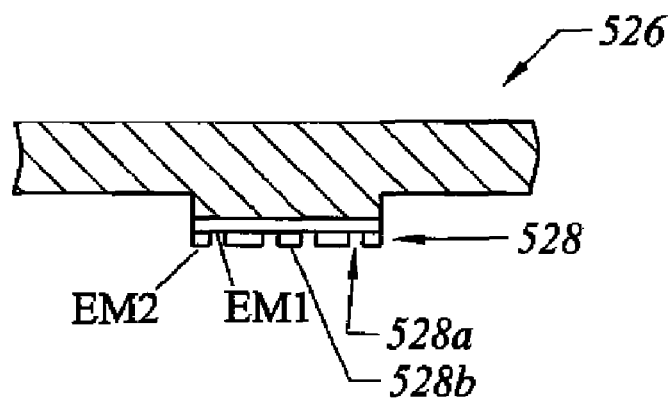
FIG. 26 is a cross-sectional view of a template in accordance with a sixth embodiment of the present invention.
Figure 27:
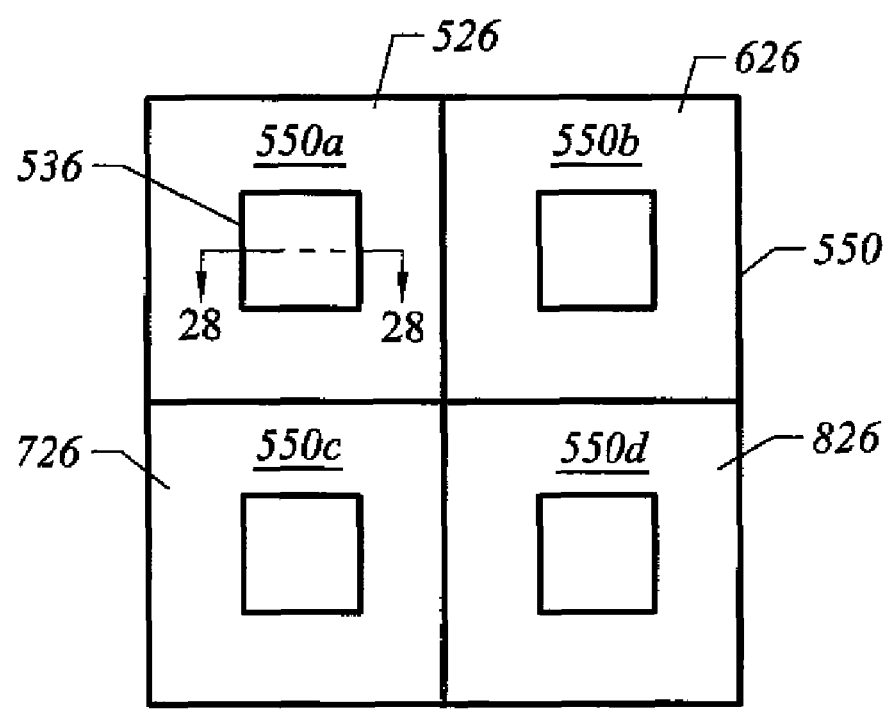
FIG. 27 is a top down view of a substrate employed to fabricate the template, shown in FIG. 26, in accordance with a seventh embodiment of the present invention.

Referring to FIGS. 3, 26 and 27, were it desired to concurrently apply an electromagnetic field across the mold, template 526 may be employed. Template 526 is formed from a body 550 of a suitable material, such as fused silica. An exemplary material is standard 6025 fused silica having measurements, on a side, of approximately 152.4 mm. Four templates 526, 626, 726, and 826 are formed, concurrently, in four separate regions 550a, 550b, 550c and 550d, respectively. For simplicity of the present disclosure, fabrication of template 526 is discussed with the understanding that the discussion with respect to template 526 applies with equal weight to templates 626, 726 and 826.

Figure 17:
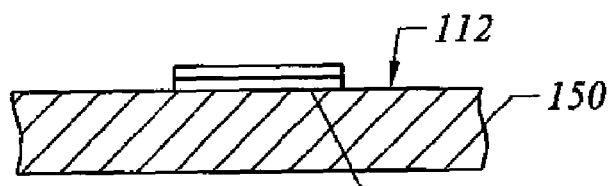
Figure 28:
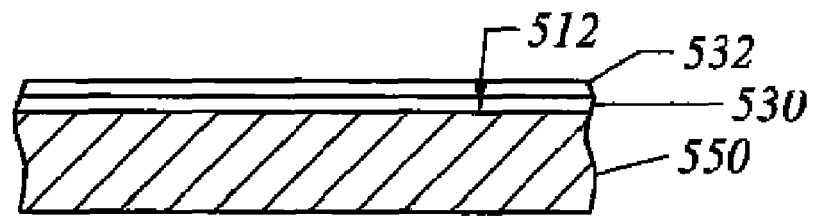
FIG. 28 is a cross-sectional view of a region of the substrate shown in FIG. 27 taken along lines 28-28.
Figure 29:
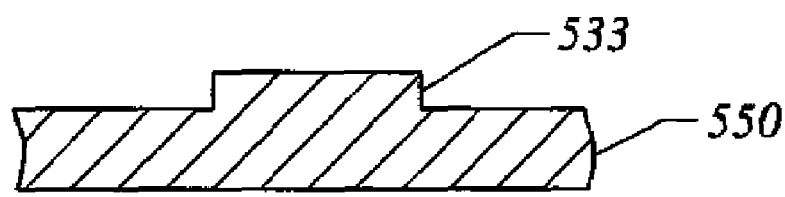
FIGS. 29-30 are cross-sectional views of the region shown in FIG. 28 demonstrating the various processes employed to fabricate the template shown in FIG. 26.
Figure 30:
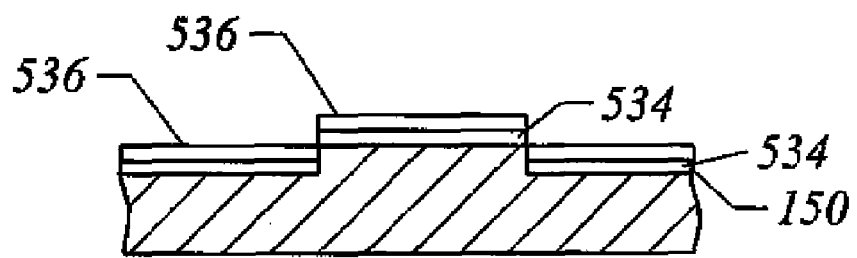

Referring to FIGS. 28 and 29, body 550 has a chrome layer 530 present on an entire side 512 thereof. A mesa 533 is formed on body 550 in the manner discussed above with respect to FIGS. 16-18. A layer of indium tin oxide (ITO) 534 is then deposited over the entire side 512 of body 550 using standard techniques, shown in FIG. 30. Deposited atop of the ITO layer 534 is a silicon oxide layer $SiO_2$ that is patterned and etched employing standard techniques to form recessions 528a and protrusions 528b, shown in FIG. 26. In this manner, the nadir of recessions 128a are formed from ITO and protrusions 528b are formed from ITO. Understanding that protrusions 528a are formed from an electrically insulative material, it is realized that the electromagnetic field, $EM_1$, proximate to recess 528a is greater than the electromagnetic field, $EM_2$, which is proximate to protrusions 528b. As a result, imprinting material 36a proximate to mold 528 is more likely to be drawn into recessions 528a, thereby reducing the time required to conform material 36a to mold 528.

The embodiments of the present invention described above are exemplary. Many changes and modifications may be made to the disclosure recited above, while remaining within the scope of the invention. For example, the use of electromagnetic filed may prove beneficial in ensuring that imprint material fully fill the features on the mold, thereby avoiding discontinuities in the imprinting layer. Such discontinuities occur when imprinting material fails to fill the recessions of the mold. This may be due to various environment and material based parameters, such as capillary attraction between a protrusion and a surface in superimposition therewith. Applying an electromagnetic field to attract imprinting material to the mold will overcome these properties. Therefore, the scope of the invention should not be limited by the above description, but instead should be determined with reference to the appended claims along with their full scope of equivalents.

What is claimed is:

1. A method for forming a conductive template, the method comprising:
   providing a substrate;
   forming a mesa on the substrate; and
   forming a plurality of recessions and projections on the mesa with a nadir of the recessions comprising electrically conductive material and the projections comprising electrically insulative material, wherein forming the plurality of recessions further includes depositing a layer indium tin oxide on the substrate and depositing a layer of insulative material on the layer of indium tin oxide.

2. The method as recited in claim 1 wherein the mesa is substantially transparent to a predetermined wavelength of radiation.

3. The method as recited in claim 1 wherein forming further includes fabricating a plurality of spaced-apart electrically conductive region on the mesa.

4. The method as recited in claim 1 wherein forming the plurality of recessions further includes depositing a layer of conductive material on the substrate and depositing a layer of insulative material on the layer of conductive material; and patterning the insulative layer to form said plurality of recessions, with said plurality of projections extending from a surface of the substrate.

5. The method as recited in claim 1 wherein forming the plurality of recessions further includes forming a plurality of spaced apart conductive regions on the substrate, with regions of the substrate not in superimposition with the spaced-apart conductive regions being exposed, defining exposed regions, and forming, on the exposed regions, electrically insulative material, with the electrically insulative material and the conductive regions forming a patterned layer having a plurality of vias.

6. The method as recited in claim 1 wherein forming further includes depositing a layer of patterning material on the template and patterning the patterning material to expose regions of the substrate disposed, defining a patterned layer, depositing a layer of conductive material on the patterned layer, and removing the patterned layer, thereby leaving a plurality of spaced-apart electrically conductive regions on the mesa and covering the plurality of spaced-apart electrically conductive regions with an electrically insulative layer and patterning the layer to expose the plurality of spaced-apart electrically conductive regions.

7. The method as recited in claim 1 wherein providing further includes forming the substrate from a material selected from a set of materials consisting essentially of quartz, fused-silica, silicon, sapphire, organic polymers, siloxane polymers, borosilicate glass, fluorocarbon polymers, and metal.

8. The method as recited in claim 7 wherein the mesa allows ultraviolet radiation to propagate therethrough.

9. A method for forming a conductive template, the method comprising:
providing a substrate;
forming a mesa on the substrate, with the mesa consisting of material that is substantially transparent to a predetermined wavelength of radiation;
forming a plurality of recessions and projections on the mesa with a nadir of a subset of the recessions including electrically conductive material to form a plurality of electrical conductive regions, wherein forming the plurality of recessions further includes forming the plurality of recessions from depositing a layer of indium tin oxide on the substrate, followed by depositing a layer insulative material on the layer on indium tin oxide.

10. The method as recited in claim 9 wherein forming the plurality of recessions further includes providing the plurality of electrically conducting regions to be selectively activated.

11. The method as recited in claim 9 wherein forming the plurality of recessions further includes depositing a layer of conductive material on the substrate and depositing a layer of insulative material on the layer of conductive material; and patterning the insulative layer to form a plurality of vias therein extending from a surface of the insulative layer and terminating in the layer of conductive material.

12. The method as recited in claim 9 wherein forming the plurality of recessions further includes forming a plurality of spaced apart conductive regions on the substrate, with regions of the substrate not in superimposition with the spaced-apart conductive regions being exposed, defining exposed regions, and forming, on the exposed regions, electrically insulative material, with the electrically insulative material and the conductive regions forming a patterned layer having a plurality of vias.

13. The method as recited in claim 9 wherein providing further includes forming the substrate from a material selected from a set of materials consisting essentially of quartz, fused-silica, silicon, sapphire, organic polymers, siloxane polymers, borosilicate glass, fluorocarbon polymers, and metal.

14. A method for forming a conductive template, the method comprising:
providing a substrate;
forming a plurality of recessions and projections on the substrate with a nadir of a subset of the recessions including electrically conductive material to form a plurality of electrically conductive regions by depositing a plurality of spaced-apart conductive regions on the substrate, followed by depositing a layer insulative material on the layer on plurality of electrically conductive regions, wherein forming the plurality of recessions further includes depositing the layer of indium tin oxide on the substrate and depositing a layer of insulative material on the layer of indium tin oxide; and patterning the insulative layer to form a plurality of vias therein extending from a surface of the insulative layer and terminating in the layer of indium tin oxide.

15. The method as recited in claim 14 wherein forming the plurality of recessions further includes providing the plurality of electrically conducting regions to be selectively activated.

16. The method as recited in claim 14 wherein providing further includes forming the substrate from a material selected from a set of materials consisting essentially of quartz, fused-silica, silicon, sapphire, organic polymers, siloxane polymers, borosilicate glass, fluorocarbon polymers, and metal.

17. A method for forming a conductive template, the method comprising:
providing a substrate;
forming a plurality of recessions and projections on the substrate with a nadir of a subset of the recessions including electrically conductive material to form a plurality of electrically conductive regions by depositing a plurality of spaced-apart conductive regions on the substrate, followed by depositing a layer insulative material on the layer on plurality of electrically conductive regions, wherein forming the plurality of recessions further includes forming the layer of indium tin oxide as a plurality of spaced apart conductive regions on the substrate, with regions of the substrate not in superimposition with the spaced-apart conductive regions being exposed, defining exposed regions, and forming, on the exposed regions, electrically insulative material, with the electrically insulative material and the conductive regions forming a patterned layer having a plurality of vias.

* * * * *